(12) United States Patent
Yoon et al.

(10) Patent No.: US 9,039,462 B2
(45) Date of Patent: May 26, 2015

(54) CELL VOLTAGE MEASURING CONNECTOR FOR FUEL CELL STACK

(71) Applicants: Hyundai Motor Company, Seoul (KR); Kia Motors Corporation, Seoul (KR)

(72) Inventors: Byung Chan Yoon, Incheon (KR); Haeng Jin Ko, Seoul (KR); Jung Do Suh, Seoul (KR); Young Bum Kum, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 78 days.

(21) Appl. No.: 13/887,842

(22) Filed: May 6, 2013

(65) Prior Publication Data
US 2013/0316560 A1 Nov. 28, 2013

(30) Foreign Application Priority Data
May 4, 2012 (KR) .................. 10-2012-0047429

(51) Int. Cl.
| | |
|---|---|
| H01R 13/514 | (2006.01) |
| H01R 13/62 | (2006.01) |
| H01R 13/436 | (2006.01) |
| H01R 13/639 | (2006.01) |
| H01M 8/04 | (2006.01) |
| G01R 1/04 | (2006.01) |
| H01M 8/24 | (2006.01) |

(52) U.S. Cl.
CPC ............. *H01R 13/62* (2013.01); *H01R 13/4365* (2013.01); *H01R 13/639* (2013.01); *H01R 2201/26* (2013.01); *G01R 1/0416* (2013.01); *H01M 8/2465* (2013.01); *H01M 8/04552* (2013.01); *H01M 2250/20* (2013.01); *Y02E 60/50* (2013.01); *Y02T 90/32* (2013.01)

(58) Field of Classification Search
CPC ........... H01R 13/4362; H01R 13/4223; H01R 13/4361; H01R 13/506; H01R 13/4365; H01R 13/4368; H01R 13/4367; H01R 13/436
See application file for complete search history.

(56) References Cited

U.S. PATENT DOCUMENTS

| | | | | |
|---|---|---|---|---|
| 5,967,859 | A | * | 10/1999 | Cecil et al. .................... 439/752 |
| 6,860,767 | B2 | * | 3/2005 | Takahashi et al. ............ 439/752 |
| 7,179,135 | B2 | * | 2/2007 | Osada et al. .................. 439/752 |

(Continued)

FOREIGN PATENT DOCUMENTS

| | | |
|---|---|---|
| JP | 2004079192 A | 3/2004 |
| JP | 2007200631 A | 8/2007 |
| JP | 2007200632 A | 8/2007 |

(Continued)

*Primary Examiner* — Xuong Chung Trans
(74) *Attorney, Agent, or Firm* — Mintz Levin Cohn Ferris Glovsky and Popeo, P.C.; Peter F. Corless

(57) ABSTRACT

A connector that may be prevented from detaching from separating plates of a stack even when vibrations or an external impact of a vehicle occurs by maintaining a locking state in which locking bosses of a CPA are inserted into lock grooves of terminals of separating plates. In addition, connecting points of connecting pieces of connecting terminals are spaced apart to not contact each other with respect to a contact line. The connecting terminals are not detached from the separating plates even when the separating plates is a ultra-slim film having a thickness of about 0.1 mm or less, making it possible to increase a reliability of a product.

18 Claims, 12 Drawing Sheets

(56) References Cited

U.S. PATENT DOCUMENTS 7,226,678 B2   6/2007  Kato et al.
7,258,943 B2 * 8/2007  Ariyoshi et al. .............. 429/430
7,862,951 B2 * 1/2011  Komiyama et al. ........... 429/468

FOREIGN PATENT DOCUMENTS

| JP | 2010192384 A | 9/2010 |
| KR | 10-2010-0058995 | 6/2010 |
| KR | 10-1090626 | 12/2011 |

* cited by examiner

CELL VOLTAGE MEASURING CONNECTOR FOR FUEL CELL STACK

CROSS-REFERENCE TO RELATED APPLICATION

This application claims under 35 U.S.C. §119(a) the benefit of Korean Patent Application No. 10-2012-0047429, filed on May 4, 2012, the entire contents of which are incorporated herein by reference.

BACKGROUND (a) Technical Field

The present invention relates to a cell voltage measuring connector for a fuel cell stack, and more particularly, to a cell voltage measuring connector for a fuel cell stack in which a locking boss of a connection position assurance component (CPA) is inserted into a locking recess of a terminal of a separating plate to remain locked to prevent a connector from detaching from the separating plate of a stack due to an external impact such as a vibration or a collision of a vehicle.

(b) Background Art

In general, a fuel cell, which is a high efficiency clean energy source, has been increasingly used in various areas, and particularly, a Polymer Electrolyte Membrane Fuel Cell (PEMFC) among various types of fuel cells operates at a low temperature relative to other fuel cells, and has rapid start and response characteristics, therefore is being actively developed as a mobile electric power for a vehicle.

A stack of a PEMFC is formed through laminating of unit cells as required, each of which unit cells includes a Membrane Electrode Assembly (MEA) formed of a fuel electrode, an air electrode, and a polyelectrolyte film between the fuel electrode and the air electrode, and a separating plate which is referred to as a bipolar plate, and is made of a metal material.

Electric potential generated in a cell corresponds to about 0.6 V to 1.3 V and a plurality of cells are laminated in series to produce an electric power necessary for driving the vehicle. A current collector and a compression plate are disposed at opposite sides of the laminated separating plates, respectively, and a tie bar is installed to pass through the current collector and the compression plate, which maintains the stack configured as above in an assembly state.

Meanwhile, to check performance and failure of the stack in a vehicle, the separating plate of each cell is connected to a control circuit (e.g., a circuit that includes an electronic control unit for operating a fuel cell system in a measuring device and a vehicle) via a connector and a conducting wire, and a voltage of each cell is measured. Terminals inserted into the connector are protruded at predetermined locations on a side surface of the separating plate, and thus when a stack assembly is completed, the terminals form a terminal line on a side surface of the stack, and the connector is mounted to the terminal line.

However, since the connector according to the related art is formed integrally with a length that corresponds to the whole stack, and is manufactured to have the terminals of all the separating plates inserted into the connector, when an alignment of the separating plates is not substantially accurate when the stack is manufactured, it may be impossible to assemble the connector in the stack due to a misalignment of the terminals of the separating plates. Thus, when the connector is mounted, the terminals of the separating plates may be deflected (e.g., deformed) or damaged. Further, since the connector is used in a vehicle and is influenced by vibrations or an impact due to driving of the vehicle, a voltage value may not be accurately measured and the connector may be separated from the stack when the contact states of the connector and the terminals of the separating terminals are not substantially firm. For example, the measured voltage values may fluctuate.

A cell voltage measuring connector for a fuel cell stack of a vehicle of the related art, includes a housing that has a terminal insertion slit into which a terminal of one of a plurality of terminal rows formed at sides of separating plates of a stack on a rear surface thereof is inserted, a connecting terminal insertion aperture that communicates with the terminal insertion slit and is formed on a front surface thereof; a base frame that has an aperture that corresponds to the connecting terminal insertion aperture; a terminal positioning assurance (TPA) terminal formed in the base frame and inserted into the TPA terminal insertion aperture; a TPA that has a side fixing end formed on a side surface of the base frame and fixedly attached to a side surface of the housing; a terminal connecting portion inserted into the connecting terminal insertion aperture of the housing through the aperture and connected to the terminal of the separating plate; and a wire chucking portion wired to the terminal connecting portion and connected to an end of a wire connected to a control circuit.

However, the cell voltage measuring connector for a fuel cell stack in the related art may easily separate from the separating plates due to vibrations and an impact of the vehicle, thus deteriorating a reliability of the product. Further, when the separating plates are thin films having a thickness of about 0.1 mm or less, a contact force of the terminal connecting portion becomes vulnerable and the connecting terminals may easily separate from the terminals of the separating plates.

SUMMARY

The present invention provides a cell voltage measuring connector for a fuel cell stack in which a connector may be prevented from detaching from separating plates of a stack when vibrations or an external impact of a vehicle occur by maintaining a locking state in which locking bosses of a CPA are inserted into lock grooves of terminals of the separating plates, and connecting points of connecting pieces of connecting terminals are spaced apart to avoid contacting each other with respect to a contact line, whereby the connecting terminals are not detached from the separating plates even when the separating plates is an ultra-slim film having a thickness of about 0.1 mm or less, making it possible to increase a reliability of a product.

The present invention also provides a cell voltage measuring connector for a fuel cell stack in which, when the connector is detached to replace a component, an end of a separating tool is inserted into a lock releasing aperture of a CPA without disassembling a panel, and a locking state of the CPA is released by raising the CPA to easily detach the connector.

In accordance with one aspect of the present invention, a cell voltage measuring connector for a fuel cell stack mounted to terminal rows formed by a plurality of terminals formed on sides of separating plates of the stack may include: a housing that has terminal insertion slits on a rear surface thereof, connecting terminal insertion apertures that communicate with the terminal insertion slits on a front surface thereof, TPA terminal insertion apertures disposed above the connecting terminal insertion apertures, and locks that correspond to lock grooves formed in the terminals of the separating plates; connecting terminals each having a terminal connecting portion inserted into the connecting terminal insertion aperture and connected to the terminal of the separating plate, and a wire chucking portion that extends from the terminal connecting portion to surround a wire; a terminal positioning assurance component (TPA) mounted to a front surface of the housing to press-fit the connecting terminals inserted into the housing; and a CPA locked with the lock grooves when inserted into the locks to prevent the housing from detaching from the separating plates.

In accordance with another aspect of the present invention, locking bosses may be formed on opposite side surfaces of the CPA, and locking steps may be formed at opposite sides of the locks to be stopped by the locking bosses. In addition, a plurality of stoppers and a plurality of locking bosses may be formed at lower portions of a front surface of the CPA, stopping steps that contact the stoppers may be formed on an upper surface of the housing to restrict a position of the CPA before the CPA is locked, and locking grooves coupled to the locking bosses may be formed at an inner side of the housing.

In accordance with yet another aspect of the present invention, a lock releasing aperture that releases lock of the CPA may be formed on a front surface of the CPA. Further, the terminal connecting portion may have connecting pieces widened while contacting opposite side surfaces of the terminal to prevent connecting points the connecting pieces from contacting each other with respect to a contact line.

In accordance with a further aspect of the present invention, recessed surfaces may be formed on opposite surfaces of the housing to prevent contacting each other, side fixing pieces may be formed at opposite sides of the TPA to correspond to the recessed surfaces, and the side fixing pieces of the TPA may be attached to the recessed surfaces of the housing during assembly thereof.

In accordance with a still further aspect of the present invention, first locking bosses may be formed on the recessed surfaces to be coupled to the side fixing pieces, second locking bosses may be formed on an upper surface of the housing, upper fixing pieces may be formed at upper portions of the TPA to be coupled to the second locking bosses, fixing steps may be formed on a lower surface of the housing at a predetermined interval, lower fixing pieces inserted between the fixing steps may be formed at lower portions of the TPA, the TPA may include apertures that correspond to the connecting terminal insertion apertures, and TPA terminals inserted into the connecting terminal insertion apertures may protrude from an inner surface of the TPA.

Moreover, the terminal connecting portion of the connecting terminal may have a parallelepiped shape having an opened front side, terminal insertion slits may be formed on an upper surface and a lower surface of the terminal connecting portion, and front ends of left and right side surfaces of the terminal connecting portion may have V-shaped connecting pieces which are bent to extend inward. The rear sides of the left and right side surfaces of the terminal connecting portion may have support pieces bent to extend inward and then bent vertically to extend in an upward direction.

As described above, a connector may be prevented from detaching from separating plates of a stack even when vibrations or an external impact of a vehicle occur by maintaining a locking state in which locking bosses of a CPA are inserted into lock grooves of terminals of separating plates, and connecting points of connecting pieces of connecting terminals are spaced apart to prevent from contacting each other with respect to a contact line, whereby the connecting terminals are not detached from the separating plates even when the separating plates is an ultra-slim film having a thickness of about 0.1 mm or less, making it possible to increase a reliability of a product.

Further, when the connector is to be detached to replace a component, an end of a separating tool may be inserted into a lock releasing aperture of a CPA without disassembling a panel, and a locking state of the CPA may be released by raising the CPA to easily separate the connector.

BRIEF DESCRIPTION OF THE DRAWINGS

The above and other features of the present invention will now be described in detail with reference to exemplary embodiments thereof illustrated the accompanying drawings which are given hereinafter by way of illustration only, and thus are not limitative of the present invention, and wherein.

Figure 1:
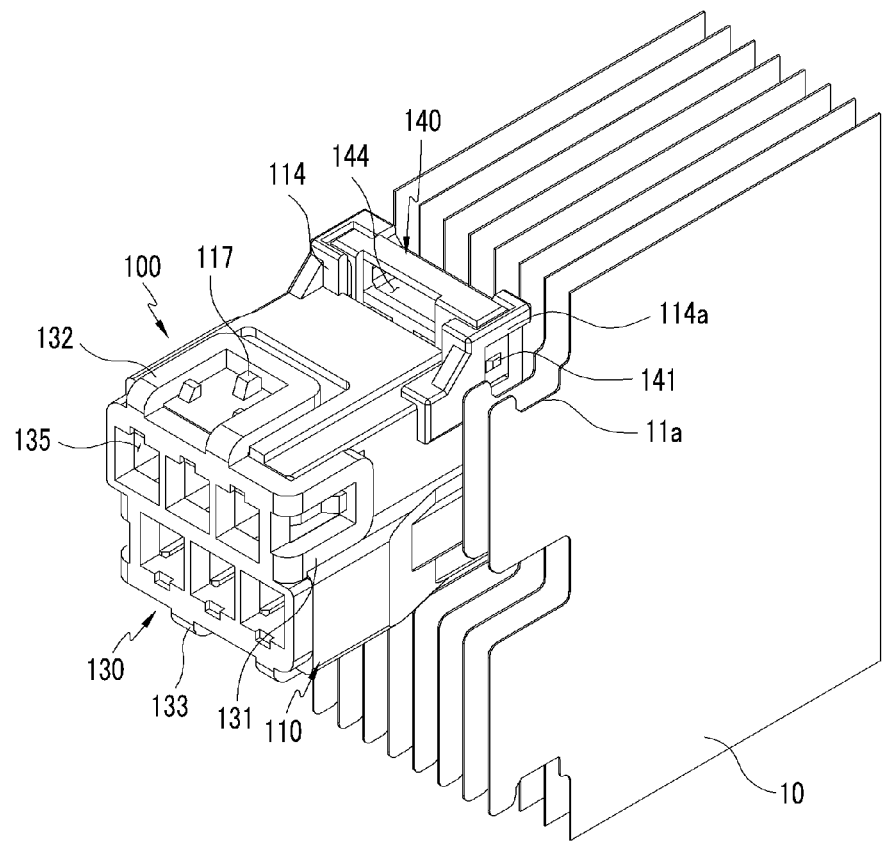
FIG. 1 is an exemplary view showing a mounting state of a cell voltage measuring connector for a fuel cell stack according to an exemplary embodiment of the present invention.

It should be understood that the accompanying drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, fuel cell vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, a cell voltage measuring connector for a fuel cell stack according to an exemplary embodiment of the present invention will be described in detail with reference to the accompanying drawings.

Figure 2:
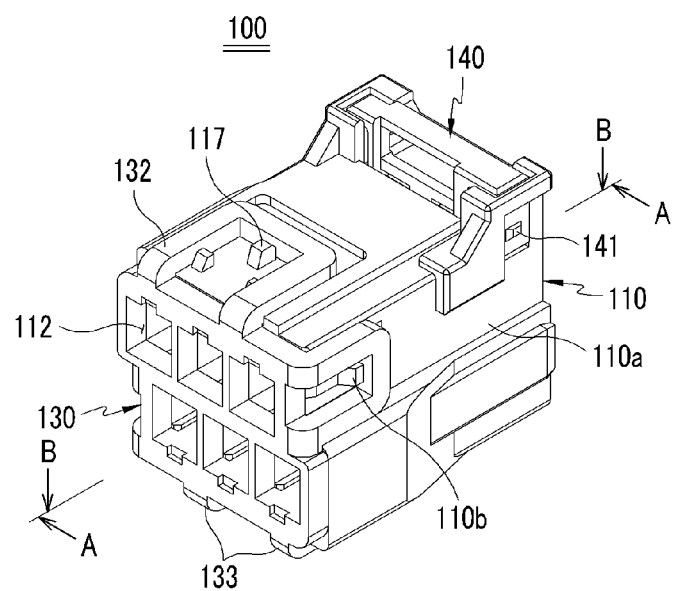
FIG. 2 is an exemplary front view showing the cell voltage measuring connector for a fuel cell stack according to the exemplary embodiment of the present invention.
Figure 3:
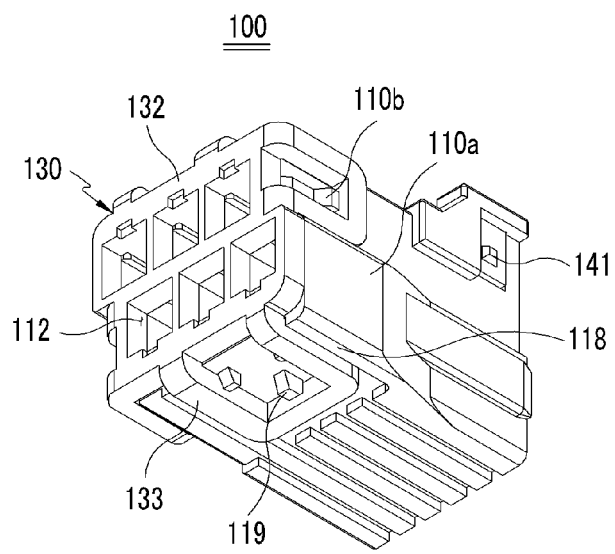
FIG. 3 is an exemplary bottom view showing the cell voltage measuring connector for a fuel cell stack according to the exemplary embodiment of the present invention.
Figure 4:
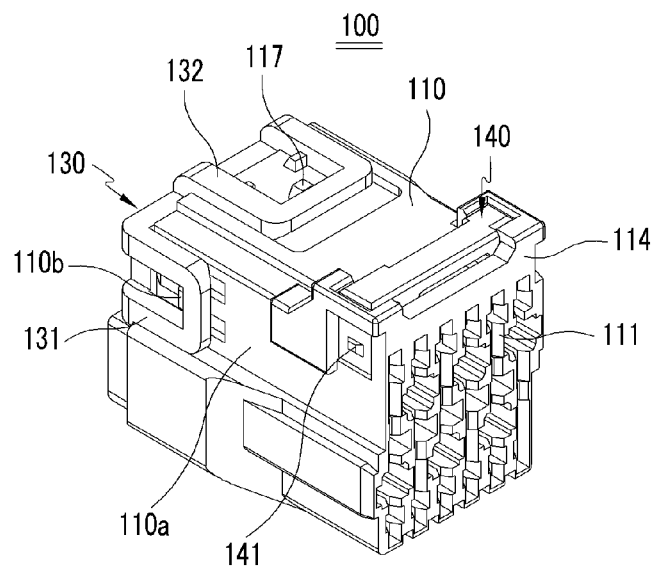
FIG. 4 is an exemplary rear view showing the cell voltage measuring connector for a fuel cell stack according to the exemplary embodiment of the present invention.
Figure 5:
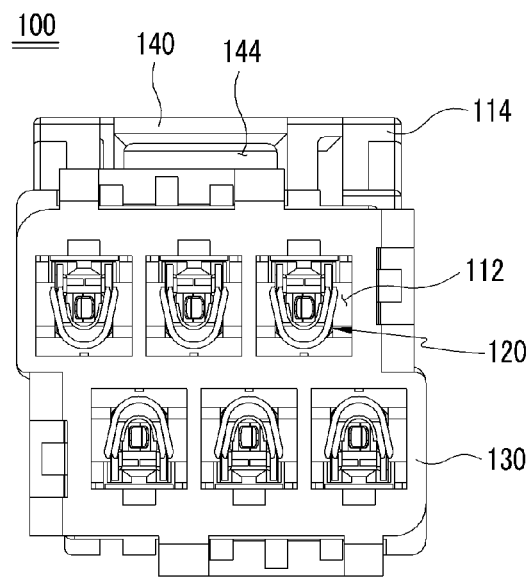
FIG. 5 is an exemplary front view showing the cell voltage measuring connector for a fuel cell stack according to the exemplary embodiment of the present invention.
Figure 6:
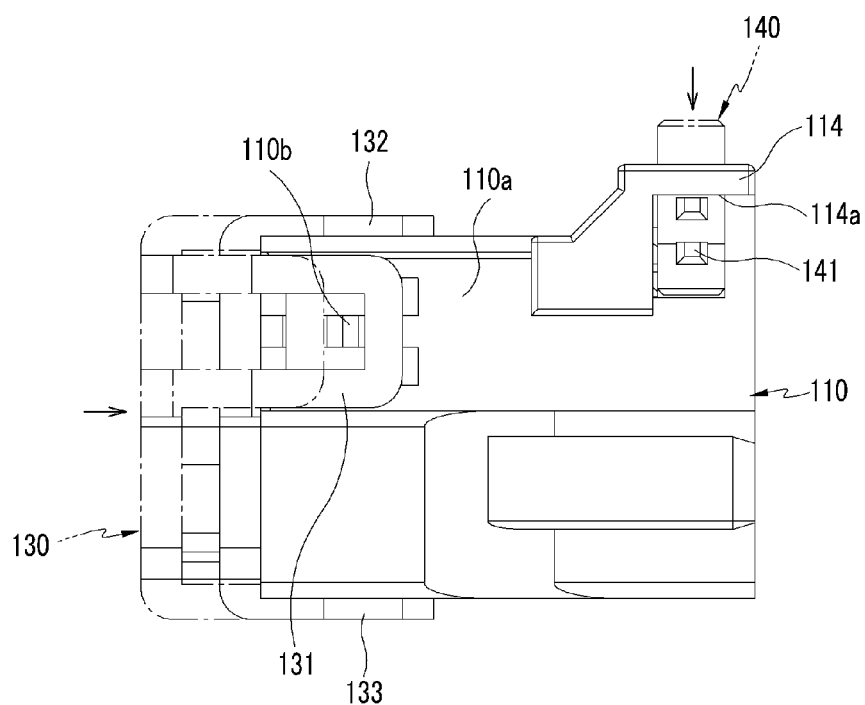
FIG. 6 is an exemplary side view showing the cell voltage measuring connector for a fuel cell stack according to the exemplary embodiment of the present invention.
Figure 7:
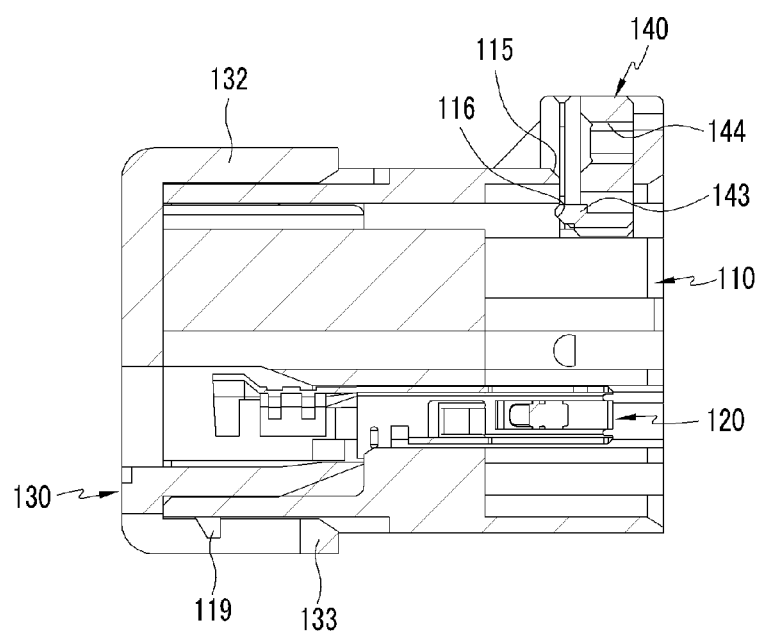
FIG. 7 is an exemplary sectional view taken along line A-A of FIG. 2 according to the exemplary embodiment of the present invention.
Figure 8:
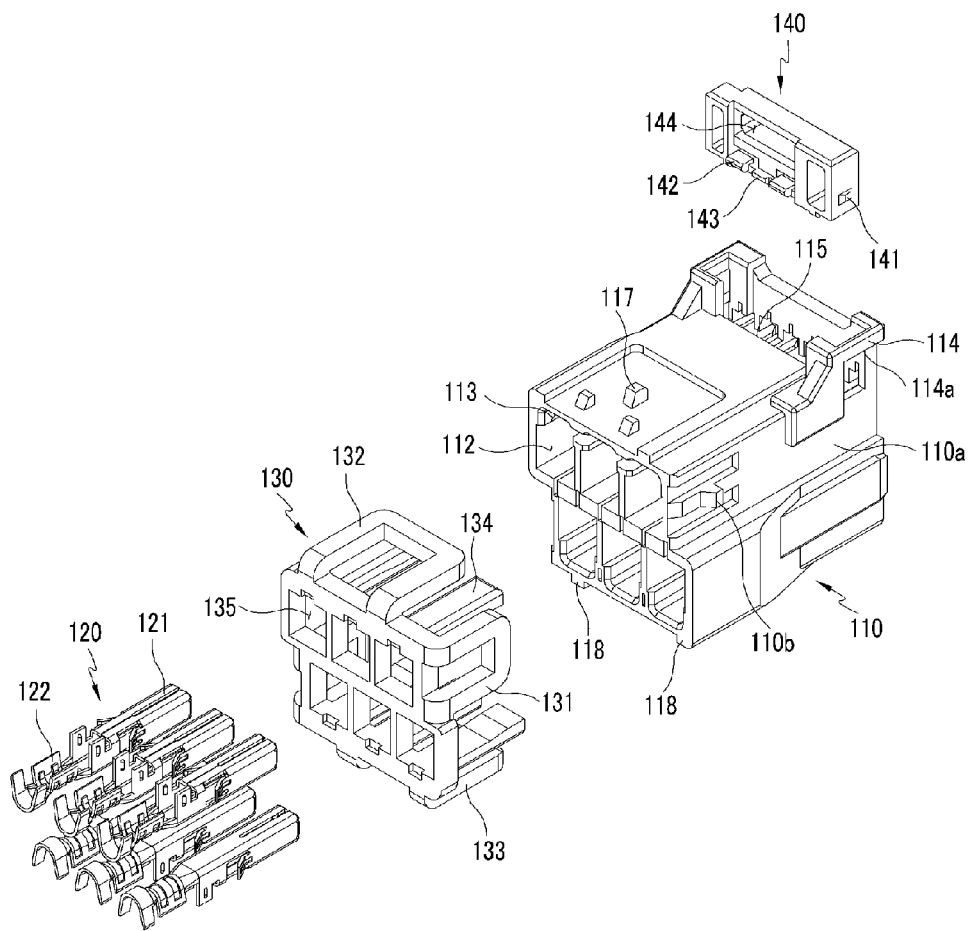
FIG. 8 is an exemplary detailed front view showing the cell voltage measuring connector for a fuel cell stack according to the exemplary embodiment of the present invention.
Figure 9:
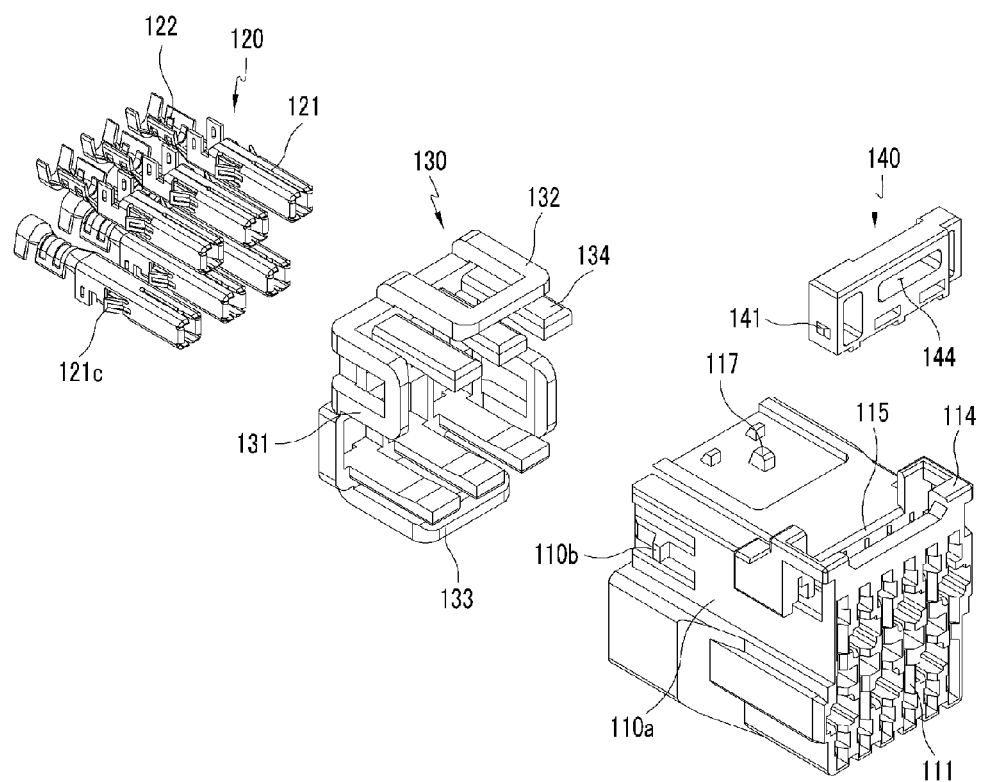
FIG. 9 is an exemplary detailed view showing the cell voltage measuring connector for a fuel cell stack according to the exemplary embodiment of the present invention.
Figure 10:
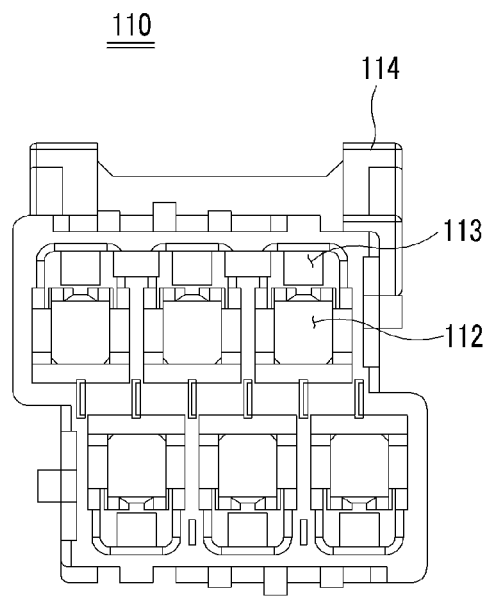
FIG. 10 is an exemplary front view showing a housing according to the exemplary embodiment of the present invention.
Figure 11:
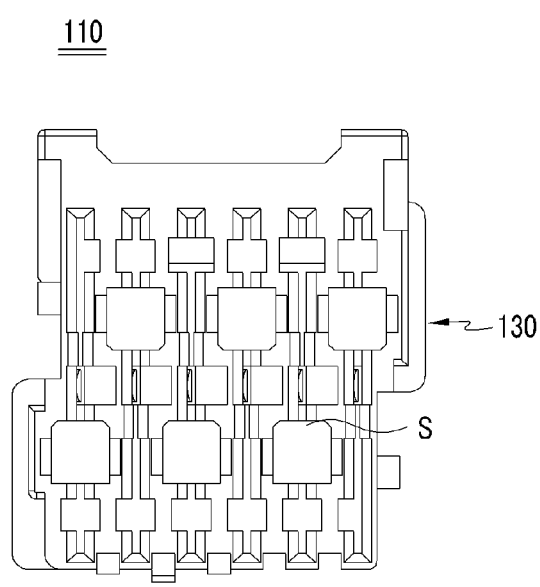
FIG. 11 is an exemplary rear view showing the housing according to the exemplary embodiment of the present invention.
Figure 12:
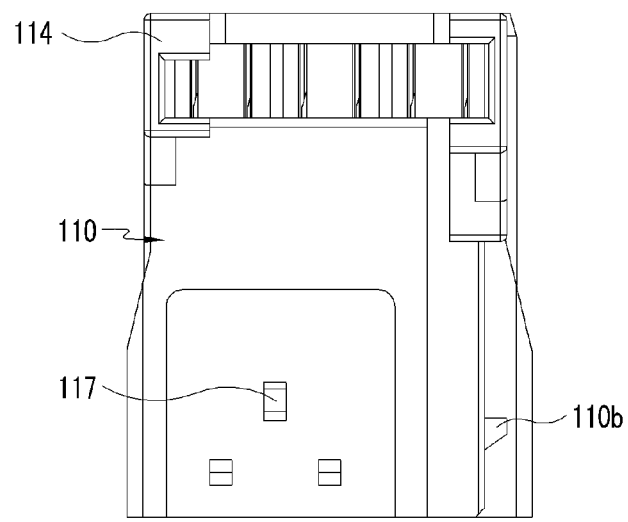
FIG. 12 is an exemplary plan view showing the housing according to the exemplary embodiment of the present invention.
Figure 13:
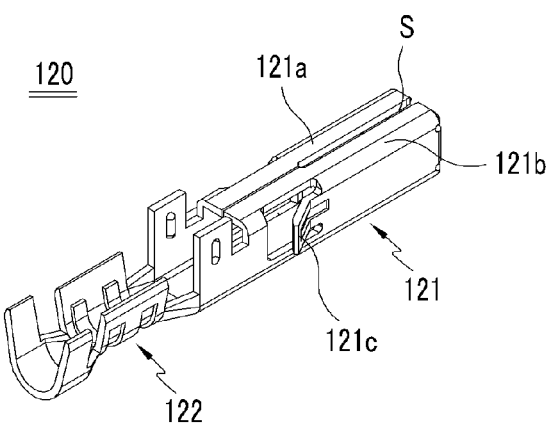
FIG. 13 is an exemplary view showing a connecting terminal according to the exemplary embodiment of the present invention.
Figure 14:
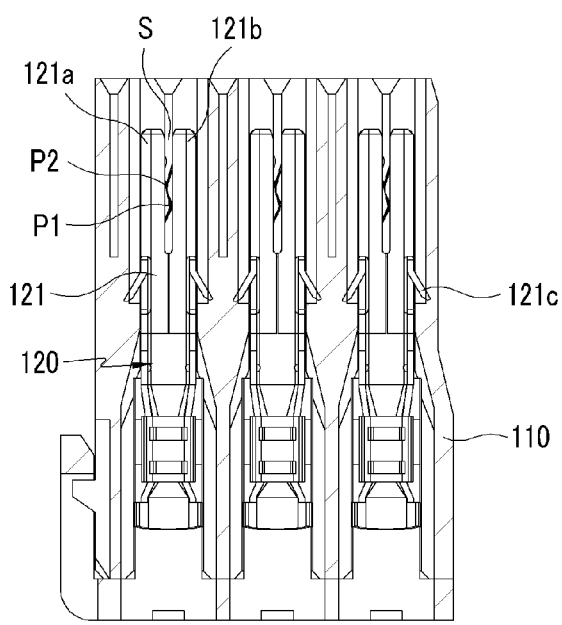
FIG. 14 is an exemplary sectional view taken along line B-B of FIG. 1 according to an exemplary embodiment of the present invention.

FIG. 1 is an exemplary view showing a mounting state of a cell voltage measuring connector for a fuel cell stack according to an exemplary embodiment of the present invention. FIG. 2 is an exemplary front view showing the cell voltage measuring connector for a fuel cell stack according to the exemplary embodiment of the present invention. FIG. 3 is an exemplary bottom view showing the cell voltage measuring connector for a fuel cell stack according to the exemplary embodiment of the present invention. FIG. 4 is an exemplary rear view showing the cell voltage measuring connector for a fuel cell stack according to the exemplary embodiment of the present invention. FIG. 5 is an exemplary front view showing the cell voltage measuring connector for a fuel cell stack according to the exemplary embodiment of the present invention. FIG. 6 is an exemplary side view showing the cell voltage measuring connector for a fuel cell stack according to the exemplary embodiment of the present invention. FIG. 7 is an exemplary sectional view taken along line A-A of FIG. 2. FIG. 8 is an exemplary detailed front view showing the cell voltage measuring connector for a fuel cell stack according to the exemplary embodiment of the present invention. FIG. 9 is an exemplary detailed view showing the cell voltage measuring connector for a fuel cell stack according to the exemplary embodiment of the present invention. FIG. 10 is an exemplary front view showing a housing according to the exemplary embodiment of the present invention. FIG. 11 is an exemplary rear view showing the housing according to the exemplary embodiment of the present invention. FIG. 12 is an exemplary plan view showing the housing according to the exemplary embodiment of the present invention. FIG. 13 is an exemplary view showing a connecting terminal according to the exemplary embodiment of the present invention. FIG. 14 is an exemplary sectional view taken along line B-B of FIG. 1.

Referring to the drawings, a cell voltage measuring connector for a fuel cell stack according to the exemplary embodiment of the present invention may be mounted to terminal rows, which are formed by a plurality of terminals 11 formed on sides of separating plates 10 of the stack, and may include: a housing 110 that has terminal insertion slits 111 on a rear surface thereof, connecting terminal insertion apertures 112 that communicate with the terminal insertion slits 111 on a front surface thereof, TPA terminal insertion apertures 113 disposed above the connecting terminal insertion apertures 112, and locks 114 that correspond to lock grooves 11a formed in the terminals 11 of the separating plates 10; connecting terminals 120 each having a terminal connecting portion 121 inserted into the connecting terminal insertion aperture 112 and connected to the terminal 11 of the separating plate 10, and a wire chucking portion 122 that extends from the terminal connecting portion 121 to surround a wire; a TPA 130 mounted to a front surface of the housing 110 to press-fit the connecting terminals 120 inserted into the housing 110; and a CPA 140 locked with the lock grooves 11a when inserted into the locks 114 to prevent the housing 110 from detaching from the separating plates 10.

In particular, the cell voltage measuring connector 100 for a fuel cell stack according to the exemplary embodiment of the present invention may include a plurality of terminals 11 formed on sides of the separating plates 10 of the stack to be mounted to the terminal rows formed by the terminals 11, and may include the housing 110 having the terminal insertion slits 111 on a rear surface thereof.

Connecting terminals 112 that communicate with the terminal insertion slits 111 may be formed on a front surface of the housing 110, and TPS terminal insertion apertures 113 may be formed at upper portions of the connecting terminal insertion apertures 112. Locks 114 that correspond to lock grooves 11a formed in the terminals 11 of the separating plates 10 may be formed on an upper surface of the housing 110.

Furthermore, the cell voltage measuring connector 100 may include a plurality of connecting terminals 120. Each of the connecting terminals 120 may have a terminal connecting portion 121 inserted into the connecting terminal insertion aperture 112 and connected to the terminal 11 of the separating plate 10, and a wire chucking portion 122 that extends from the terminal connecting portion 121 to surround a wire;

The cell voltage measuring connector 100 may further include a TPA 130 mounted to a front surface of the housing 110 to press-fit the connecting terminals 120 inserted into the housing 110. In addition, a CPA 140 locked with the lock grooves 11a when inserted into the locks 114 to prevent the housing 110 from detaching from the separating plates 10.

Additionally, locking bosses 141 may be formed on opposite side surfaces of the CPA 140, and locking steps 114 may be formed at opposite sides of the locks 114 to be stopped by the locking bosses 141. A plurality of stoppers 142 and a plurality of locking bosses 143 may be formed at lower portions of a front surface of the CPA 140, stopping steps 115 that contact the stoppers 142 may be formed on an upper surface of the housing 110 to restrict a position of the CPA 140 before the CPA 140 is locked. Locking grooves 116 coupled to the locking bosses 143 may be formed at an inner side of the housing 110. A lock releasing aperture 144 that releases the lock of the CPA 140 may be formed on a front surface of the CPA 140.

The terminal connecting portion 121 may have connecting pieces 121a and 121b widened while contacting opposite side surfaces of the terminal 11 to prevent the connecting points P1 and P2 of the connecting pieces 121a and 121b to contact each other with respect to a contact line L.

Furthermore, recessed surfaces 110a may be formed on opposite surfaces of the housing 110 to not each other, side fixing pieces 131 may be formed at opposite sides of the TPA 130 to correspond to the recessed surfaces 110a, and the side fixing pieces 131 of the TPA 130 may be attached to the recessed surfaces 110a of the housing 110 during assembly thereof. First locking bosses 110b may be formed on the recessed surfaces 110a to be coupled to the side fixing pieces 131, second locking bosses 117 may be formed on an upper surface of the housing 110, and upper fixing pieces 132 may be formed at upper portions of the TPA 130 to be coupled to the second locking bosses 117.

Fixing steps may be formed on a lower surface of the housing 110 at a predetermined interval and lower fixing pieces 133 inserted between the fixing steps 118 may be formed at lower portions of the TPA 130. The lower fixing pieces 133 may be locked (e.g., coupled) with third locking bosses 119.

The TPA 130 may include apertures 135 that correspond to the connecting terminal insertion apertures 112, and TPA terminals 134 inserted into the connecting terminal insertion apertures 112 protrude from an inner surface of the TPA 130. The terminal connecting portion 121 of the connecting terminal 120 may have a parallelepiped shape having an opened front side. In addition, terminal insertion slits S may be formed on an upper surface and a lower surface of the terminal connecting portion 121 and front ends of left and right side surfaces of the terminal connecting portion 121 may have V-shaped connecting pieces 121a which are bent to extend inward. Rear sides of the left and right side surfaces of the terminal connecting portion 121 may have support pieces 121b which are bent to extend inward and then bent to extend upward.

Hereinafter, an operation of the cell voltage measuring connector 100 for a fuel cell stack according to the exemplary embodiment of the present invention will be described.

First, when the TPA 130 is arranged on a front surface of the housing 110 and then is moved forward when the TPA 130 is assembled in the housing 110, the lower fixing pieces 133 of the TPA 130 may be inserted between the two fixing steps 118 formed on a lower surface of the housing 110 and the lower fixing pieces 133 of the TPA 130 may be locked with the third locking bosses 119. Then, the side fixing pieces 131 of the TPA 130 may be attached to the recessed surfaces 110a formed on opposite surfaces of the housing 110 and may be locked with the first locking bosses 110b, and the upper locking pieces 132 of the TPA 130 may be locked with the second locking bosses 117 formed on an upper surface of the housing 110.

The connecting terminals 120 may be inserted into the apertures 135 of the TPA 130 and the connecting terminal insertion apertures 112 of the housing 110, wherein the support pieces 121b may be stopped by an inner side of the housing 110 and may be obstructed by the TPA terminals 134 of the TPA to prevent the connecting terminals 120 from detaching from the housing 110 when external vibrations or impact occur.

When the assembled connector 110 is mounted to the separating plates 10 of the stack, the separating plates 10 of the stack may be inserted into the terminal insertion slits 111 formed on a rear surface of the housing 110 and the locks 114 may correspond to the lock grooves 11a formed in the terminals 11 of the separating plates 10. Further, when the CPA 140 is inserted into the locks 114 of the housing 110, the stoppers 142 and the locking bosses 143 of the CPA 140 may contact the stopper 142, and when the CPA 140 is pushed downward, the locking bosses 143 may be locked with the locking grooves 116 of the housing 110 to prevent movement of the CPA 140. Thus, a locking state of the locking bosses 143 of the CPA 140 in which the locking bosses 143 are inserted into the lock grooves 11a of the housing 110 may be maintained and the connector 100 may be prevented from detaching from the separating plates 10 of the stack even when vibrations or an impact of the vehicle occur, making it possible to increase reliability of the product.

Figure 15A:
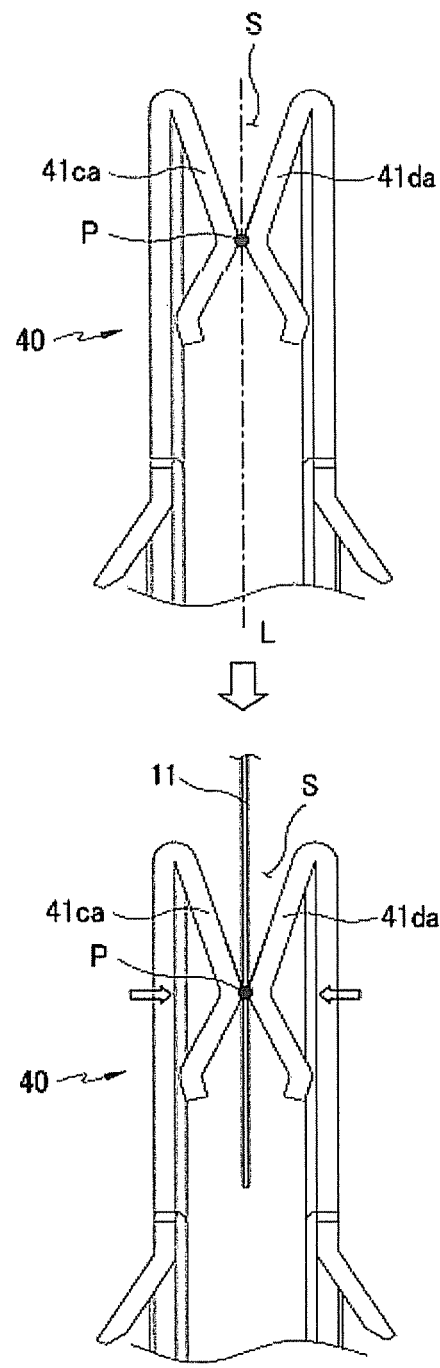
FIGS. 15A and 15B are exemplary sectional views for comparing a connecting piece of a conventional connecting terminal and a connecting piece of the connecting terminal according to the exemplary embodiment of the present invention.
Figure 15B:
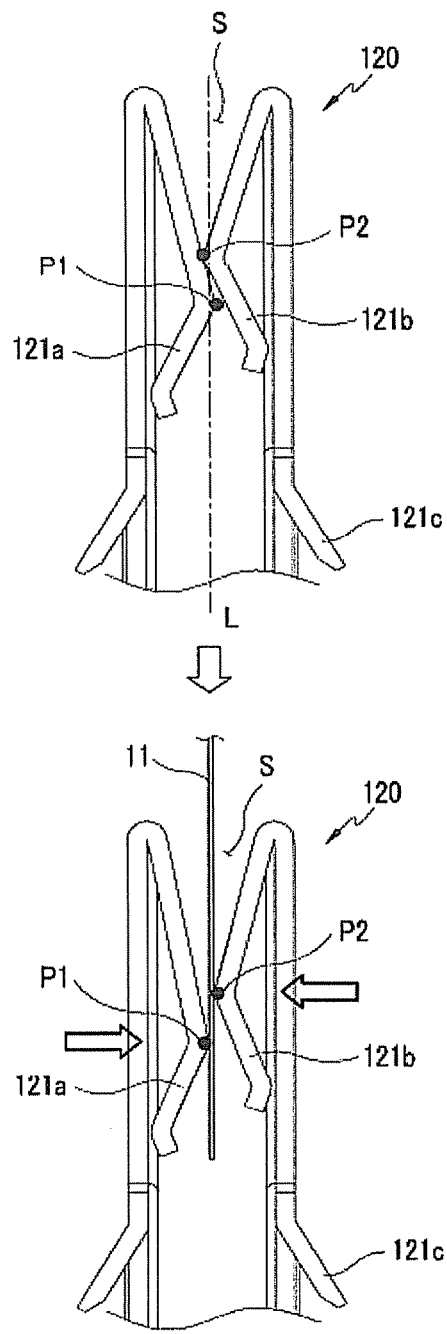

Further, in the connecting terminals 40 according to the related art, since the connecting points P of the connecting pieces 41ca and 41da are located to contact each other, the contact force between the connecting pieces 41ca and 41cd may be lowered causing the connector to detach from the separating plates 10 when the terminals 11 of the separating plates 10 are ultra-slim films having a thickness of about 0.1 mm or less (see FIG. 15A). However, in the cell voltage measuring connector 100 for a fuel cell stack according to the exemplary embodiment of the present invention, since the connecting points P1 and P2 of connecting pieces 121a and 121b of connecting terminals 120 are disposed apart to prevent contacting each other with respect to a contact line L, the connecting pieces 121a and 121b are supported by a larger contact force (indicated by an arrow) when the terminals 11 of the separating plates 10 are inserted into the terminal insertion slits S. Thus, the connecting terminals 120 may not detach from the separating plates 10 even when the separating plates 10 is a ultra-slim film having a thickness of about 0.1 mm or less, making it possible to increase a reliability of a product (see FIG. 15B).

Figure 16:
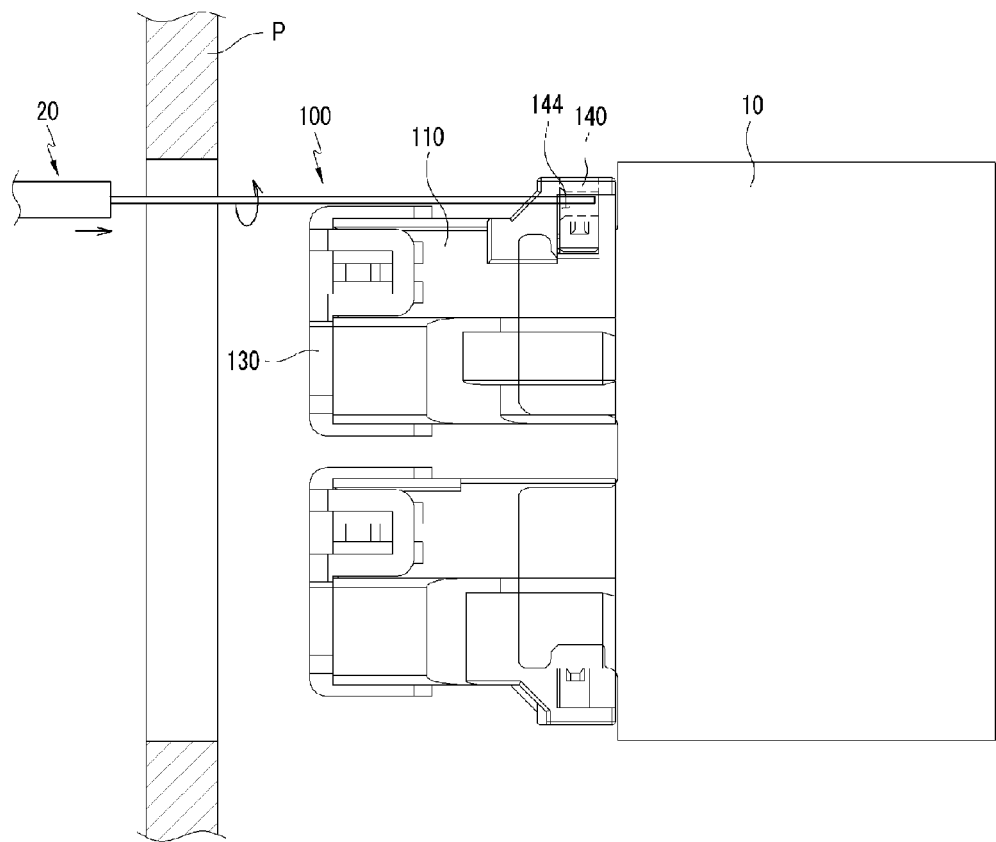
FIG. 16 is a view showing a process of separating a connector by using a separating tool.

Meanwhile, as shown in FIG. 16, when the connector 100 is detached to replace a component, a separating tool 200 may be first inserted into a opening of a panel P, an end of the separating tool 200 may be inserted into the lock releasing aperture 144 of a CPA, and a locking state of the CPA may be released by raising the CPA 140 to easily detach the connector 100.

As described above, a connector 100 may be prevented from detaching from separating plates 10 of a stack even when vibrations or an external impact of a vehicle occur by maintaining a locking state in which locking bosses 143 of a CPA 140 are inserted into lock grooves 11a of terminals of separating plates, and connecting points P1 and P2 of connecting pieces 121a and 121b of connecting terminals 120 are spaced apart to prevent contacting each other with respect to a contact line L, whereby the connecting terminals 120 are not detached from the separating plates 10 even when the separating plates 10 is a ultra-slim film having a thickness of about 0.1 mm or less, making it possible to increase a reliability of a product.

Although a cell voltage measuring connector for a fuel cell stack according to the present invention has been described by way of an example, it is apparent that the present invention may also be applied to various fields other than a fuel cell stack.

What is claimed is:

1. A cell voltage measuring connector for a fuel cell stack mounted to terminal rows formed by a plurality of terminals formed on sides of separating plates of the stack, the cell voltage measuring connector comprising:
   a housing including:
      terminal insertion slits on a rear surface thereof;
      connecting terminal insertion apertures that communicate with the terminal insertion slits on a front surface thereof;
      terminal positioning assurance terminal insertion apertures disposed above the connecting terminal insertion apertures; and
      locks that correspond to lock grooves formed in the terminals of the separating plates;
   connecting terminals each having a terminal connecting portion inserted into the connecting terminal insertion aperture and connected to the terminal of the separating plate and a wire chucking portion that extends from the terminal connecting portion to surround a wire;
   a terminal positioning assurance component (TPA) mounted to a front surface of the housing to press-fit the connecting terminals inserted into the housing; and
   a connector position assurance component (CPA) locked with the lock grooves when inserted into the locks to prevent the housing from detaching from the separating plates,
   wherein the terminal connecting portion has connecting pieces widened while contacting opposite side surfaces of the terminal to prevent connecting points of the connecting pieces from contacting each other with respect to a contact line, and
   the connecting terminals remain attached to the separating plates even when the separating plates constitute an ultra-slim film.

2. The cell voltage measuring connector of claim 1, wherein locking bosses are formed on opposite side surfaces of the CPA, and locking steps are formed at opposite sides of the locks to be stopped by the locking bosses.

3. The cell voltage measuring connector of claim 1, further comprising:
   a plurality of stoppers and a plurality of locking bosses formed at lower portions of a front surface of the CPA;
   stopping steps that contact the stoppers are formed on an upper surface of the housing to restrict a position of the CPA before the CPA is locked; and
   locking grooves coupled to the locking bosses are formed at an inner side of the housing.

4. The cell voltage measuring connector of claim 1, wherein a lock releasing aperture that releases the lock of the CPA is formed on a front surface of the CPA.

5. The cell voltage measuring connector of claim 1, further comprising:
   recessed surfaces formed on opposite surfaces of the housing; and
   side fixing pieces formed at opposite sides of the TPA to correspond to the recessed surfaces, wherein the side fixing pieces of the TPA are attached to the recessed surfaces of the housing during assembly thereof.

6. The cell voltage measuring connector of claim 1, further comprising:
   first locking bosses formed on the recessed surfaces to be coupled to the side fixing pieces;
   second locking bosses formed on an upper surface of the housing;
   upper fixing pieces formed at upper portions of the TPA to be coupled to the second locking bosses;
   fixing steps formed on a lower surface of the housing at a predetermined interval;
   lower fixing pieces inserted between the fixing steps are formed at lower portions of the TPA, wherein the TPA includes apertures that correspond to the connecting terminal insertion apertures, and TPA terminals inserted into the connecting terminal insertion apertures protrude from an inner surface of the TPA.

7. The cell voltage measuring connector of claim 1, wherein the terminal connecting portion of the connecting terminal has a parallelepiped shape having an opened front side.

8. The cell voltage measuring connector of claim 1, further comprising:
   terminal insertion slits formed on an upper surface and a lower surface of the terminal connecting portion, wherein front ends of left and right side surfaces of the terminal connecting portion have V-shaped connecting pieces which are bent to extend inward.

9. The cell voltage measuring connector of claim 1, wherein rear sides of the left and right side surfaces of the terminal connecting portion have support pieces which are bent to extend inward and then bent to extend upward.

10. A cell voltage measuring connector for a fuel cell stack, comprising:
    a housing includes:
       terminal insertion slits on a rear surface thereof to be mounted to terminal rows, which are formed by a plurality of terminals formed on sides of separating plates of the stack; and
       locks that correspond to lock grooves on an upper surface thereof;
    connecting terminals inserted into connecting terminal insertion apertures of the housing;
    a terminal positioning assurance component (TPA) mounted to a front surface of the housing to press-fit the connecting terminals inserted into the housing;
    a connector position assurance component (CPA) locked with the lock groove when inserted into the locks to prevent the housing from detaching from separating plates; and
    connecting terminals each having a terminal connecting portion inserted into the connecting terminal insertion aperture and connected to the terminal of the separating plate and a wire chucking portion that extends from the terminal connecting portion to surround a wire,
    wherein the terminal connecting portion has connecting pieces widened while contacting opposite side surfaces of the terminal to prevent connecting points of the connecting pieces from contacting each other with respect to a contact line, and
    the connecting terminals remain attached to the separating plates even when the separating plates constitute an ultra-slim film.

11. A cell voltage measuring connector for a fuel cell stack mounted to terminal rows formed by a plurality of terminals formed on sides of separating plates of the stack, the cell voltage measuring connector comprising:
    a housing having locks that correspond to lock grooves formed in the plurality of terminals of the separating plates;
    a connector position assurance component (CPA) locked with the lock grooves when inserted into the locks to prevent the housing from detaching from the separating plates; and
    connecting terminals each having a terminal connecting portion inserted into a connecting terminal insertion aperture and connected to the terminal of the separating plate and a wire chucking portion that extends from the terminal connecting portion to surround a wire, wherein the terminal connecting portion has connecting pieces widened while contacting opposite side surfaces of the terminal to prevent connecting points of the connecting pieces from contacting each other with respect to a contact line, and the connecting terminals remain attached to the separating plates even when the separating plates constitute an ultra-slim film.

12. The cell voltage measuring connector of claim 11, wherein the housing further includes:

terminal insertion slits on a rear surface thereof;

connecting terminal insertion apertures that communicate with the terminal insertion slits on a front surface thereof; and terminal positioning assurance terminal insertion apertures disposed above the connecting terminal insertion apertures.

13. The cell voltage measuring connector of claim 11, further comprising:

connecting terminals each having a terminal connecting portion inserted into the connecting terminal insertion aperture and connected to the terminal of the separating plate and a wire chucking portion that extends from the terminal connecting portion to surround a wire; and a terminal positioning assurance component (TPA) mounted to a front surface of the housing to press-fit the connecting terminals inserted into the housing.

14. The cell voltage measuring connector of claim 11, wherein locking bosses are formed on opposite side surfaces of the CPA, and locking steps are formed at opposite sides of the locks to be stopped by the locking bosses.

15. The cell voltage measuring connector of claim 11, further comprising:

a plurality of stoppers and a plurality of locking bosses formed at lower portions of a front surface of the CPA;

stopping steps that contact the stoppers are formed on an upper surface of the housing to restrict a position of the CPA before the CPA is locked; and locking grooves coupled to the locking bosses are formed at an inner side of the housing.

16. The cell voltage measuring connector of claim 11, wherein a lock releasing aperture that releases the lock of the CPA is formed on a front surface of the CPA.

17. The cell voltage measuring connector of claim 11, further comprising:

recessed surfaces formed on opposite surfaces of the housing; and side fixing pieces formed at opposite sides of the TPA to correspond to the recessed surfaces, wherein the side fixing pieces of the TPA are attached to the recessed surfaces of the housing during assembly thereof.

18. The cell voltage measuring connector of claim 11, further comprising:

first locking bosses formed on the recessed surfaces to be coupled to the side fixing pieces;

second locking bosses formed on an upper surface of the housing;

upper fixing pieces formed at upper portions of the TPA to be coupled to the second locking bosses;

fixing steps formed on a lower surface of the housing at a predetermined interval;

lower fixing pieces inserted between the fixing steps are formed at lower portions of the TPA, wherein the TPA includes apertures that correspond to the connecting terminal insertion apertures, and TPA terminals inserted into the connecting terminal insertion apertures protrude from an inner surface of the TPA.

* * * * *